United States Patent [19]

Mourou et al.

[11] 4,434,399
[45] Feb. 28, 1984

[54] ELECTRON-OPTICAL WIDE BAND SIGNAL MEASUREMENT SYSTEM

[75] Inventors: Gerard Mourou, Rochester, N.Y.; Janis A. Valdmanis, Columbus, Ind.; Steven L. Williamson, Henrietta, N.Y.

[73] Assignee: The University of Rochester, Rochester, N.Y.

[21] Appl. No.: 378,379

[22] Filed: May 14, 1982

[51] Int. Cl.³ .............................................. G01R 31/00
[52] U.S. Cl. ...................................... 324/96; 250/397
[58] Field of Search ............... 324/77 K, 96; 250/396, 250/397, 483.1, 487.1

[56] References Cited

U.S. PATENT DOCUMENTS 3,917,943 11/1975 Auston .............................. 250/211 J
3,921,028 11/1975 Fujisawa .................................. 315/9
4,118,627 10/1978 Porter .................................. 250/397
4,382,182 5/1983 Matsuzaka ........................... 250/397

OTHER PUBLICATIONS

D. H. Auston et al., Picosecond Optoelectronic Detection, Sampling and Correlation Measurements in Amorphous Semiconductors, Appl. Phys. Lett., 37(4), 15 Aug. 1980, pp. 371-373.

Primary Examiner—Michael J. Tokar
Attorney, Agent, or Firm—Martin Lukacher

[57] ABSTRACT

Electrical signals are measured (analyzed and displayed) with picosecond resolution and sensitivity in the microvolt (less than 100 microvolts) range by electron-optically sampling the signal. Sampling electron bursts are produced in response to a train of sub-picosecond optical pulses. A beam of these electron bursts samples successive portions of the signal as it is transmitted as a travelling wave along deflection plates which act as a transmission line. The bursts are deflected in accordance with the amplitude of the successive portions of the signal and translated into spots of light, as on a phosphor screen. The deflection is significantly less than the diameter of the spot. The deviation of the spot with respect to the position thereof in the absence of the signal on the deflection plates is translated into a difference output. The signal to be analyzed is generated, synchronously with the optical pulses, to propagate along the deflection plates in variably delayed relationship therewith. The signal is optically-induced using a separate beam of the optical pulses which is desirably chopped into optical pulses. The difference output is processed, preferably by a lock-in amplifier and signal averager; the lock-in amplifier being synchronized with the chopping of the beam into the optical pulses, and displayed on a time base synchronous with the variable delay of the optical pulses. Accordingly, the signal is displayed on an expanded time scale for measurement and other analysis.

20 Claims, 3 Drawing Figures

ELECTRON-OPTICAL WIDE BAND SIGNAL MEASUREMENT SYSTEM

DESCRIPTION

The present invention relates to a system for the measurement of electrical signals with picosecond resolution, and particularly to a signal analyzer and display system with picosecond electron-optical sampling of the signal being analyzed.

The invention is especially suitable for the measurement of small (microvolt and millivolt amplitude) transient signals, such as are produced by photodetectors, photoconductive switches and other ultra fast devices and enables the characterization of the response of such devices with picosecond accuracy.

This application is related to a copending application Ser. No. 348,127 filed in the U.S. Patent and Trademark Office on Feb. 12, 1982 in the name of J. A. Valdmanis and G. Mourou which describes a system for measurement of electrical signals by the electro-optic sampling of the signal in a travelling wave Pockels cell. The system described herein measures the signals being analyzed by electron-optically sampling the signal utilizing sampling electron burst. Electrical outputs resulting from the sampling are processed in a manner similar to that described in the above-referenced Valdmanis and Mourou application to provide a high resolution display thereof on an expanded time scale.

Sampling oscilloscopes have been used for the measurement of transient electric signals. The electronics associated with the cathode ray tube (CRT) of these sampling oscilloscopes must generate samples of successive portions of the signals of sufficient amplitude to deflect a continuous electron beam by amounts sufficient to enable the observation of the signal on the screen of the CRT. Sampling oscilloscopes are limited in sensitivity and band width by the amplifiers and other electronic devices used therein in preserving the temporal shape of the signals being analyzed while increasing their amplitude to produce sufficient deflection of the continuous electron beam in the CRT. Accordingly, measurements with picosecond resolution are difficult or impossible with conventional sampling oscilloscopes.

It has also been suggested that semiconductors may be switched fast enough to resolve electrical transients in the picosecond range (see D. H. Auston, et. al., Appl. Phys. Lett. 37 (4), 371, Aug. 15, 1980 and U.S. Pat. No. 3,917,943, which also shows an optically activated semiconductor sampling device). The resolution of the measurement is, however, constrained by the material recovery time which may exceed 10 picoseconds. Moreover, techniques similar to those discussed above in connection with sampling oscilloscopes are still required to provide displays of the signals being analyzed.

It is an object of the present invention to provide an improved system for the measurement of electrical signals, particularly electrical transients with high resolution both temporally and in amplitude (e.g., temporal resolution in the picosecond range and sensitivity in the micorovolt range, less than 100 microvolts minimum).

It is another object of the present invention to provide an improved system which enables the analysis and display of signals having very broad band width (e.g., 20 GHz and higher), such that electrical transients of duration in the picosecond range can be displayed and analyzed.

It is a still further object of the present invention to provide an improved system for the characterization of the response of optically activated devices, such as photodetectors and photoconductive switches which are ultra fast in operation (e.g., are activated in picoseconds).

Briefly described, a system for the measurement of an electrical signal with picosecond resolution which, in accordance with the invention makes use of means for generating a train of optical pulses having sub-picosecond durations. Means responsive to these optical pulses act to generate a beam of sampling electron bursts. These bursts are used for electron-optically sampling successively occurring portions of the signal being measured. A comb of successive electron bursts samples of successively occurring portion of the signal is effectively produced. A display and processing means responsive to the electron burst samples provide a display of the signal, as on an expanded time base so that the signal may readily be observed and analyzed. The electron-optical sampling means may include electron optics such as are used in the front end of streak cameras, for generating the sampling electron bursts, and deflection plates along which a travelling wave corresponding to the signal propagates in variable time delayed relationship with the electron bursts to provide a deflection of the electron burst samples as the effect to which the display and processing means responds.

The foregoing and other objects, features and advantages of the invention, as well as a presently preferred embodiment thereof, will become more apparent from a reading of the following description in connection with the accompanying drawing in which.

Figure 1:
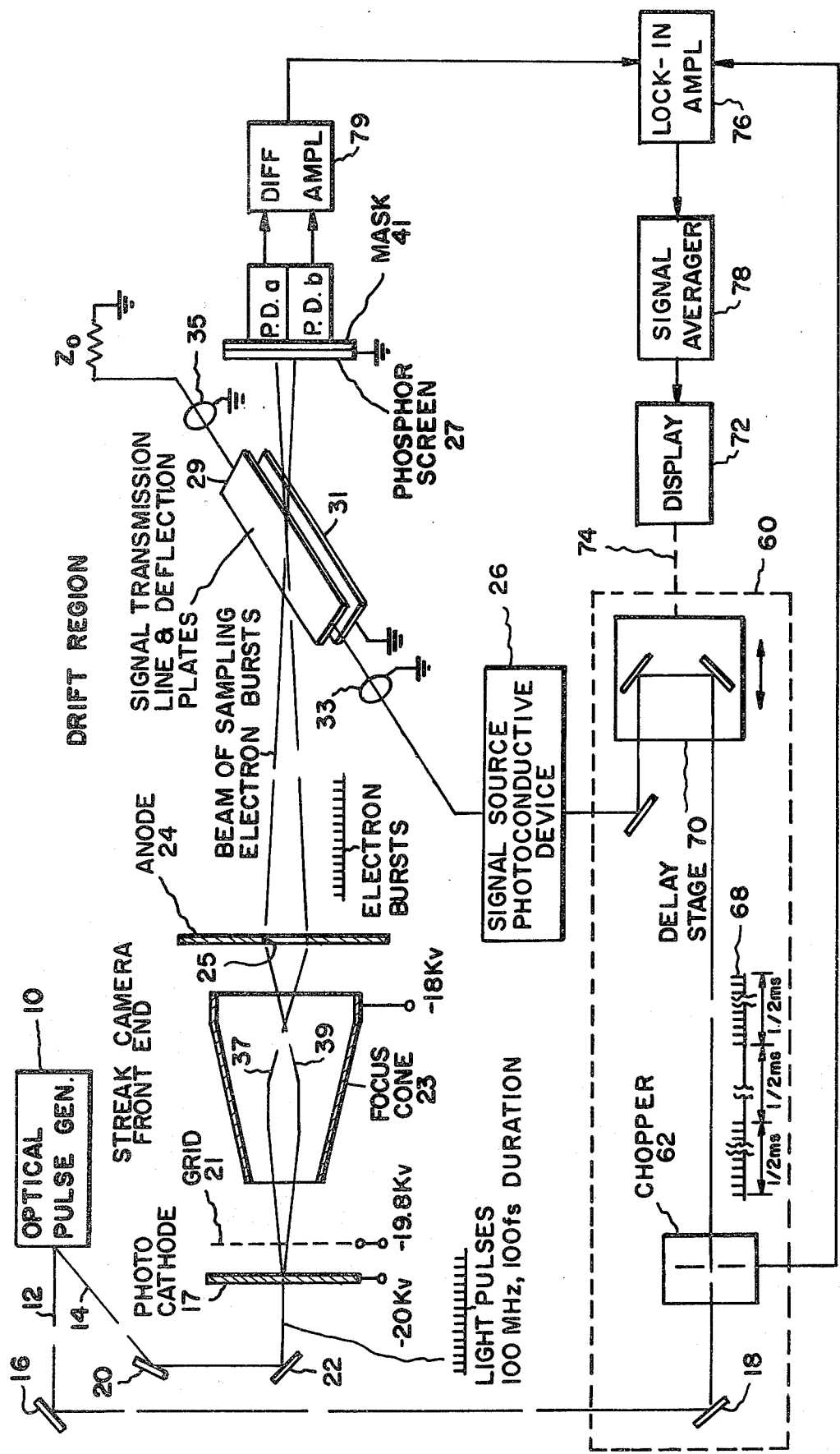
FIG. 1 is a block diagram schematically illustrating a system for the measurement of electrical signals with picosecond resolution which embodies the invention.

Referring more particularly to FIG. 1, an optical pulse generator 10 generates and transmits separate trains of simultaneously occurring pulses along separate paths 12 and 14 defined by mirrors, 16, 18, 20 and 22. The generator 10 is a laser, preferably a CW mode-locked ring dye laser which is pumped by a CW Argon laser. The ring laser operates as a colliding pulse mode-locked (CPM) laser which produces its pulses and propagates them along the paths 12 and 14. Any laser which produces picosecond or subpicosecond pulse may be used. The pulses should be of a wave length matched to the photocathode 17 of the electron-optical sampling means 19 of the system. The pulses are repetitive at a high rate, for example, 100 MHz and are of sub-picosecond duration, e.g., 120 femtoseconds (fs). The path 14 is to the electron-optical sampling means 19 wherein sampling electron bursts are generated. The optical pulses which propagate along the path 12 are used to synchronize the generation and propagation of the signals which are to be measured. These pulses drive a signal source 26, which in this embodiment is a photoconductive device. The system is operative to characterize the response of that device. Any signals which are produced or switched for electron-optical sampling in synchronism with the sampling electron bursts (which are, of course, in synchronism with the optical pulses) may be measured by means of the system. When the signal source 26 is a photoconductive device, such as a photodetector or solid state light actuated switch, it is directly activated by the optical pulses. The signals which are measured are therefore automatically synchronized with the optical pulses and the sampling electron bursts.

The sampling means 19 contains electron optics for producing electron bursts which are replicas of the optical pulses on the photocathode 17. The electron optics and the photocathode may be the same as used in conventional streak cameras, for example, of the picotron type which has been manufactured by several concerns, such as RCA Corporation. The electron optics are a grid 21, suitably 100 mesh, a focusing cone 23 and an anode 24 having an aperture 25 through which the beam of sampling electron bursts passes along a path through a drift region to a phosphor screen 27.

A pair of deflection plates 29 and 31 provide a wide band signal transmission line along which a traveling wave corresponding to the signal propagates. The propagation is lengthwise of the plates. One of the plates 29 is connected, as by coaxial cables 33 and 35 to the signal source 26 and to a termination resistance $Z_0$ at opposite ends thereof. The other deflection plate 31 is grounded. Accordingly, the plates 29 and 31 define a vacuum strip line; the entire sampling means being under vacuum. The resistance $Z_0$ is matched to the strip line impedance. A signal is generated and propagates along the length of the deflection plates (as a travelling wave) each time the source 26 is activated by an optical pulse. The beam of sampling electron bursts is focused by the electron optics at a "soft focus" (e.g., 100 micron diameter at the focal point). The focal point is centered along the width of the deflection plates and between these plates 29 and 31. Another focal point is in the focus cone 23. The ray lines 37 and 39 illustrate the focusing of the beam of sampling electron bursts. In the absence of an electrical signal on the deflection plates 29 and 31 the beam is incident on the phosphor screen at spot centered at a certain point (See FIG. 2). Each burst makes a separate spot of light when it strikes the screen.

The speed of the electron burst depends upon the accelerating voltage applied to the electron optics. With a 20 Kv accelerating voltage as shown in FIG. 1, by way of example, the speed of the electron bursts is approximately the velocity of light divided by 3.6. The transit time of the bursts between the deflection plates depends upon the width of the plates, the direction of propagation of the bursts. For example, with a wide band width configuration, the deflection plates may have a width of 0.6 millimeter. Then the electron bursts accelerated by 20 KV will have, while passing through the plates 29 and 31 have a transit time of approximately 7.5 picoseconds. Accordingly, only a very short (less than 7.5 picoseconds) portion of the signal transmitted along the length of the plates 29 and 31 will effect the bursts. This effect will be a deflection of the bursts. The spot on the phosphor screen 27 then is deflected slightly. The deflection will be less than the diameter of the spot. Nevertheless, this deflection provides an output proportional to the amplitude of the sample of the signal. It will be noted that each electron burst produces a separate spot, not a line or sequence of spots as would be the case if the electron beam was on continuously or had a transit time under the deflection plates long with respect to the travelling wave propagating on the plates. It would then be necessary to resolve the line rather than the position of a spot on the phosphor screen 27. The response of photodetectors, even photomultiplier tubes, is not sufficient to resolve the line. However, such photodetectors can respond to changes in light intensity as spots due to successive electron bursts are deflected and appear at different positions even within a spot diameter. This will be explained more fully in connection with FIG. 3.

Figure 2:
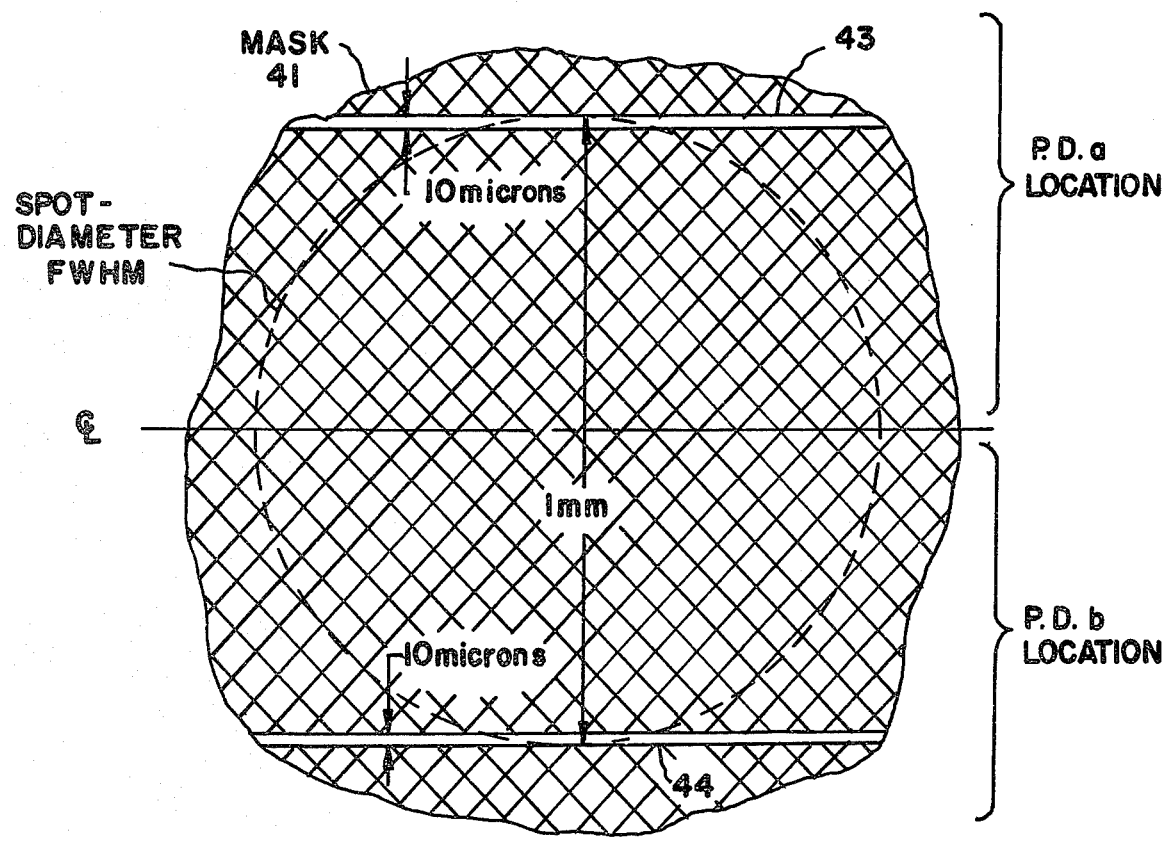
FIG. 2 is a fragmentary view looking through a mask into the phosphor screen of the electron-optical sampler shown in FIG. 1.

The band width is mainly determined by the transit time of the sampling electron bursts between the deflection plates. The temporal resolution of the system is a function of the transit time under the plates 29 and 33 and the width (duration in time) of the electron bursts. Accordingly, with extremely short electron bursts, for example, picosecond electron bursts, very short electrical signals can be resolved and displayed. Moreover, since the system does not depend upon large deflections it is very sensitive and may display small signal amplitudes and be sensitive to signals in the microvolt range.

two photodetectors are disposed on opposite sides of the center of centerline of the spot which is produced on the phosphor screen 27 in the absence of signal on the plates 29 and 31 (see FIG. 2). These photodetectors are indicated in FIG. 1 as P.D.a and P.D.b. They may be photomultiplier tubes (PMT). A mask 41 is located on the screen 27 and the photodetectors are in juxtaposition with the mask. An optical system (lenses) may alternatively be used to image the spot between the photodetectors.

The mask 41 has openings 43 and 44 in the form of slits. These slits are parallel to the length of the deflection plates 29 and 31 (vis. transverse and particularly perpendicular to the path of the electron beam). The slits 43 and 44 are spaced apart approximately by the spot diameter as shown in FIG. 2. The slits are equidistant from the centerline which is the center of the spot in the absence of signal on the plates 29 and 31. In a typical case, where the spot diameter at full width half maximum (FWHM) is 1 millimeter, the slits are approximately 1 millimeter apart. The photodetectors P.D.a and P.D.b are also disposed on opposite side of the centerline centered over the slits 43 and 44. It will therefore be seen that as the successive bursts are deflected, different intensities of light emanate through the different slits. The difference in the intensity of the light as detected by P.D.a and P.D.b is proportional to the amplitude of the successive portion (samples) of the signal as it travels lengthwise of the deflection plates 29 and 31.

Figure 3:
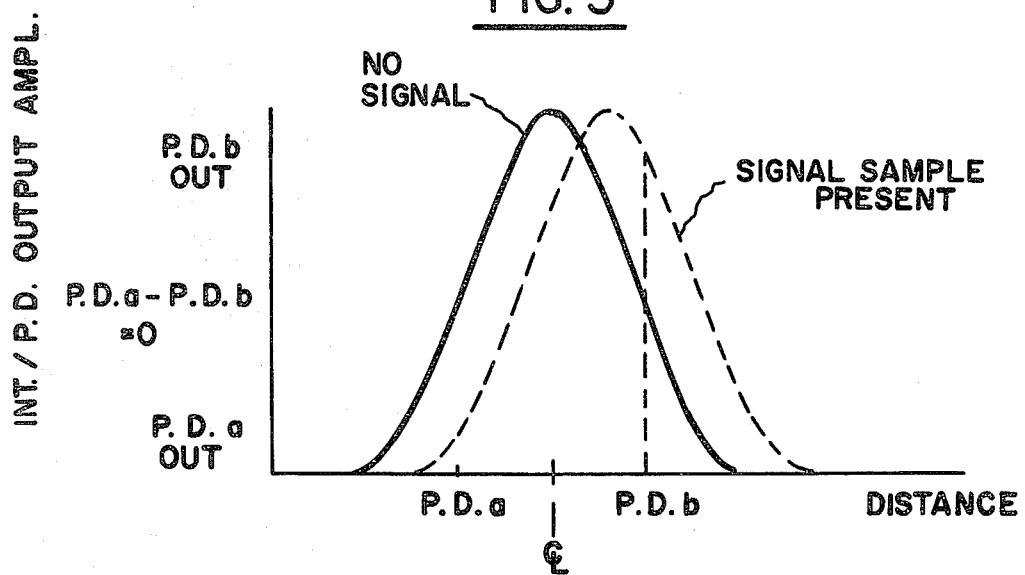
FIG. 3 illustrates curves which explain the response of photodetectors to the deflection of the electron bursts and the spots of light produced by the phosphor screen on which the bursts are incident.

FIG. 3 illustrates how the output from the sampling means is proportional to the amplitude of the signal samples. The solid line curve illustrates the intensity of the illumination in the absence of signal. Because of the location of P.D.a and P.D.b, the difference in the amplitude of the P.D.a and P.D.b outputs is then a minimum (e.g., zero amplitude). However, when a signal sample is present, the spot moves and the P.D.a and P.D.b outputs vary in inverse relationship. The difference between the P.D.a and P.D.b outputs is proportional to the sample amplitude. It will be noted that it only requires a deflection of less than a spot diameter to obtain a significant difference output from P.D.a and P.D.b. As the signal propagates along the deflection plates, the difference output changes in amplitude; each of the bursts arriving at the 100 MHz rate producing a successive output corresponding to a successive portion of the signal.

A variable delay stage 60 enables the electron bursts to sample successive portions of the signal. The variable delay stage includes a moveable corner reflector 70 through which pass the optical pulses synchronous with the electron bursts. The delay stage 70 is reciprocated along a linear path at a constant rate, for example, (1 centimeter per second). The corner reflector provides a double pass of the optical pulses before reaching the signal source 26. Since a travel of 1 millimeter of the delay stage 70 produces approximately a 6 picosecond delay, the pulses reaching the signal source 26 will be variably delayed. The signal is generated repeatedly each time a pulse reaches the signal source. Since the optical pulses are variably delayed, different portions of the signal will be coincident with successive electron bursts between the deflection plates 29 and 31. The rate of travel of the delay stage 70 is synchronous with the time base in a display 72, since the delay stage is coupled to the display as indicated schematically by the dash line 74. In the event that the display is an oscilloscope, the horizontal sweep which defines the time base is locked to the displacement of the stage 70. For example, a ramp voltage which drives the motor or electromechanical actuator which moves the delay stage 70 may be used to control the horizontal sweep. Accordingly, the time of the sweep is proportional to the variable delay of the signals which are launched and propagated into the transmission line provided by the deflection plates 29 and 31. The display is therefore a temporally enlarged replica of the signal.

A chopper 62 is used to encode the electrical signal which is applied to the plates 29 and 31. The chopper 62 may be a commercial available rotating disk chopper which chops to optical pulses into successive groups at a 1 KHz rate. The train of optical pulses which propagates along the path 12 is repetitive at 100 MHz or 10 nanosecond intervals. Each group is ½ millisecond long as shown at 68. The chopper produces a rate signal synchronous with these groups of optical pulses. A lock-in amplifier 76 tuned to the same frequency then extracts the 1 KHz signal proportional to the signal amplitude on the crystal; thus, increasing the signal to noise ratio very effectively.

The signal is applied to the display 72 by a signal averager 78 which is operative to further reduce noise and increase the sensitivity of the measurement. The lock-in amplifier 76 suitable for use in the system may include a difference amplifier 79 which obtains the difference output from P.D.a and P.D.b, as the preamplifier thereof. Such a lock-in amplifier is commercially available from EG&G, Princeton Applied Research of Princeton, New Jersey (for example, their model 124A). The signal averager 78 is also available from the same source, for example, their model 4202 or 4203.

From the foregoing description it will be apparent that there has been provided an improved system for measurement of electrical pulses with a temporal response in the picosecond range and a sensitivity in the microvolt range. Variations and modifications in the herein described system, within the scope of the invention, will undoubtedly suggest themselves to those skilled in the art. Accordingly, the foregoing description should be taken as illustrative and not in a limiting sense.

We claim:

1. A system for the measurement of an electrical signal with picosecond resolution which comprises means for generating a train of optical pulses having subpicosecond durations, means responsive to the pulses for generating a beam of sampling electron bursts, means for electron-optically sampling successively occurring portions of said signal with successive ones of said electron bursts, and means responsive to the output of said sampling means for providing a display of said signal.

2. The system according to claim 1 wherein said electron optical sampling means comprises means for transmitting a travelling wave corresponding to said signal and deflecting said bursts away from the path of said beam in the absence of said signal, means for translating said bursts after passing said transmitting and deflecting means into an optical signal.

3. The system according to claim 2 wherein said translating means comprises means for providing two optical signals which change in intensity in opposite senses in response to the amount of deflection of said bursts from said path.

4. The system according to claim 3 wherein said translating means further comprises means responsive to the difference in amplitude of said two optical signals for producing said output.

5. The system according to claim 4 wherein said difference in amplitude responsive means comprises two photodetectors spaced from each other in the direction of deflection of said bursts on opposite sides of said path for producing a pair of electrical signals, and means responsive to the difference in amplitude of said pair of electrical signals providing said output.

6. The system according to claim 2 wherein said transmitting and deflecting means comprises a pair of deflection plates having their length disposed transverse to said beam and the width of said plates such that the maximum transit time of said bursts as they pass in a direction along the width of said plates is in the picosecond range, and means for transmitting said signal such that the wave corresponding thereto travels along the length of said plates.

7. The system according to claim 6 wherein said means for generating said beam of sampling electron bursts comprises a photocathode upon which said optical pulses are incident, and electron-optical means for focusing the burst of electrons produced by said photocathode into said beam which passes between and plates.

8. The system according to claim 7 wherein said photocathode and said electron optical focusing means are provided by the front end of a streak camera.

9. The system according to claim 7 wherein said electron optical focusing means comprises a grid, focus cone, and apertured anode spaced from said photocathode in the order stated along the path of said beam toward a phosphor screen, said phosphor screen and said anode being at like potential to define a drift region there-between, said deflection plates being disposed in said draft region.

10. The system according to claim 7 wherein said electron-optical sampling means further comprises a phosphor screen disposed on the opposite side of said deflection plates from said electron-optical focusing means, said focusing means being operative to focus said electron bursts to produce successive spots of light of certain diameter on said screen, said spots being centered at a point coincident with the intersection of said beam in the absence of said signal and said screen, and a mask having a pair of openings spaced equidistant in the direction of deflection of said bursts on opposite sides of said point.

11. The system according to claim 10 wherein said openings are slits parallel to the length of said plates.

12. The system according to claim 11 wherein such mask is adjacent to said plates and said slits are spaced apart a distance approximately equal to the diameter of said spot.

13. The system according to claim 2 wherein said transmitting and deflecting means further comprises means operated by said optical pulses for generating said signal for propagation as said travelling wave in synchronism with said optical pulses.

14. The system according to claim 13 further comprising means for chopping repetitively at a substantially constant rate said optical pulses with which the generating of said signal is synchronous, and said display providing means comprises means for processing the output of said sampling in synchronism with said chopping means.

15. The system according to claim 13 wherein said generating means comprises means for variably delaying the generation of said signal with respect to said sampling electron bursts.

16. The system according to claim 15 wherein said variable delaying means comprises means for providing separate trains of said optical pulses through said electron-optical sampling means for generating said signals, and means for variably delaying the optical pulses in said signal generating train.

17. The system according to claim 15 wherein said signal is provided by a signal source including a photoconductive device which produces said signal repeatedly in response to each of said optical pulses.

18. The system according to claim 17 wherein said optical sampling pulses producing means comprises laser means for continuously generating optical pulses at a certain rate and having a duration shorter than the interval therebetween.

19. The system according to claim 18 wherein said laser is a mode-locked laser having means for producing said optical pulses at said certain rate which is of the order of 100 MHz and with said duration of the order of 100 femtoseconds.

20. The system according to claim 18 wherein means are provided for directing said pulses from said laser means along a first path to said electron-optical sampling means and a second path to said signal generation means to synchronize the repetitions of said signal with successive ones of said optical pulses.

* * * * *